US012775531B2

(12) United States Patent
Wang et al.

(10) Patent No.: US 12,775,531 B2
(45) Date of Patent: Oct. 27, 2026

(54) ACCELERATING PROGRAM-ERASE CYCLES ON MEMORY DEVICES

(71) Applicant: Micron Technology, Inc., Boise, ID (US)

(72) Inventors: Wei Wang, Dublin, CA (US); Yu-Chung Lien, San Jose, CA (US); Wenyen Chang, San Jose, CA (US); Zhenming Zhou, San Jose, CA (US); Jun Wan, San Jose, CA (US); Ying Yu Tai, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 16 days.

(21) Appl. No.: 19/088,464

(22) Filed: Mar. 24, 2025

(65) Prior Publication Data

US 2026/0288604 A1 Sep. 24, 2026

(51) Int. Cl.

| | |
|---|---|
| ***G11C 16/34*** | (2006.01) |
| ***G06F 11/18*** | (2006.01) |
| ***G11C 16/14*** | (2006.01) |
| *G06F 11/07* | (2006.01) |

(52) U.S. Cl.

CPC ............ *G06F 11/181* (2013.01); *G11C 16/14* (2013.01); *G11C 16/34* (2013.01); *G11C 16/349* (2013.01); *G11C 16/3495* (2013.01); *G06F 11/0751* (2013.01); *G11C 16/3431* (2013.01); *G11C 16/345* (2013.01)

(58) Field of Classification Search

CPC .... G11C 16/34; G11C 16/349; G11C 16/3495
See application file for complete search history.

(56) References Cited

U.S. PATENT DOCUMENTS

| | | | | |
|---|---|---|---|---|
| 5,774,400 | A * | 6/1998 | Lancaster | G11C 16/3477 365/185.24 |
| 9,934,872 | B2 * | 4/2018 | Magia | G11C 16/349 |
| 11,342,029 | B2 * | 5/2022 | Oowada | G11C 16/14 |
| 2015/0186072 | A1 * | 7/2015 | Darragh | G11C 16/3495 711/103 |
| 2016/0070643 | A1 * | 3/2016 | Shen | G11C 13/0035 711/103 |
| 2016/0093386 | A1 * | 3/2016 | Shur | G11C 16/0483 365/185.11 |
| 2016/0224267 | A1 * | 8/2016 | Yang | G11C 29/76 |
| 2018/0189123 | A1 * | 7/2018 | Jeon | G06F 3/0658 |
| 2022/0051722 | A1 * | 2/2022 | Righetti | G11C 16/10 |
| 2022/0101926 | A1 * | 3/2022 | Oowada | G11C 16/14 |
| 2024/0069733 | A1 * | 2/2024 | He | G06F 3/0604 |

* cited by examiner

*Primary Examiner* — Jonathan D Gibson

(74) *Attorney, Agent, or Firm* — Schwegman Lundberg & Woessner, P.A.

(57) ABSTRACT

This disclosure is directed to a system for fast-cycling a memory device. The system receives a fast-cycling start command to initiate a fast-cycling mode for the set of memory devices, the fast-cycling mode accelerating program-erase counts (PECs) of memory blocks to an end-of-life (EOL) condition, the EOL condition comprising a threshold number of PECs. The system, in response to receiving the fast-cycling start command, enables a stand-alone mode for an individual memory device of the set of memory devices that prevents the individual memory device from servicing host input/output requests. The system executes fast-cycling operations on the individual memory device until the EOL condition is satisfied.

20 Claims, 6 Drawing Sheets

ACCELERATING PROGRAM-ERASE CYCLES ON MEMORY DEVICES

TECHNICAL FIELD

Examples of the disclosure relate generally to memory sub-systems and, more specifically, to accelerating program-erase cycle counts (PEC) or program-erase cycling of memory devices to end-of-life (EOL) conditions.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various examples of the disclosure. The drawings, however, should not be taken to limit the disclosure to the specific examples, but are for explanation and understanding only.

DETAILED DESCRIPTION

Figure 1:
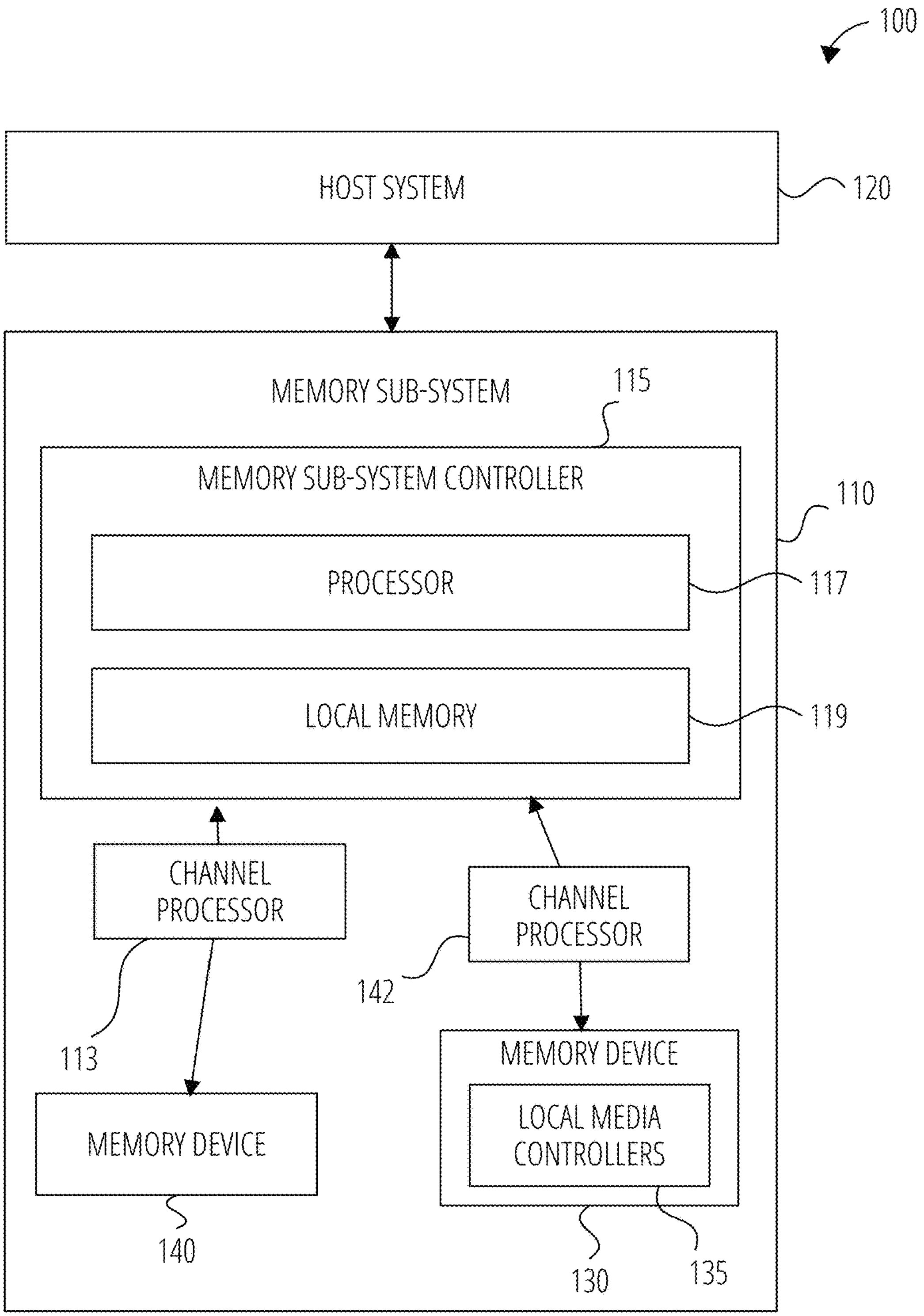
FIG. 1 is a block diagram illustrating an example computing system that includes a memory sub-system, in accordance with some examples.

The present disclosure is directed to a system including a set of memory devices and a processing device operatively coupled to the set of memory devices. The processing device is configured to perform operations that accelerate PEC of memory devices to EOL conditions through an innovative fast-cycling feature. The system achieves this by implementing a standalone mode that prevents host I/O requests and applies adjusted program and erase (PE) voltage settings to memory dies (memory devices) via channel processors. Specifically, the disclosed processing device maintains a fast-cycling status variable to track cycling progress across multiple channel processors, executes vendor-specific commands to control the fast-cycling operations, and manages the restoration of normal operation parameters once cycling is complete. This approach enhances testing efficiency by reducing the amount of time it can take to cycle a memory sub-system to EOL while maintaining voltage threshold distributions and performance characteristics that match normal cycling conditions. This can improve overall memory sub-system validation by enabling comprehensive EOL testing and media management algorithm verification in an expedited manner.

A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can send access requests to the memory sub-system, such as to store data at the memory sub-system and to read data from the memory sub-system.

The host system can send access requests (e.g., write command, read command, erase command) to the memory sub-system, such as to store data on a memory device at the memory sub-system, read data from the memory device on the memory sub-system, or write/read constructs (e.g., such as submission and completion queues) with respect to a memory device on the memory sub-system. The data to be read or written, as specified by a host request, is hereinafter referred to as "host data" or "user data."

A host request can include logical address information (e.g., logical block address (LBA), namespace) for the host data, which is the location the host system associates with the host data and a particular zone in which to store or access the host data. The logical address information (e.g., LBA, namespace) can be part of metadata for the host data. Metadata can also include error handling data (e.g., error-correcting code (ECC) code word, parity code), data version (e.g., used to distinguish age of data written), valid bitmap (which LBAs or logical transfer units contain valid data), and so forth.

The memory sub-system can initiate media management operations, such as a write operation, on host data that is stored on a memory device. For example, firmware of the memory sub-system may re-write previously written host data from a location of a memory device to a new location as part of garbage collection (GC) management operations. The data that is re-written, for example as initiated by the firmware, is hereinafter referred to as "GC data." Examples of system data include, but are not limited to, system tables (e.g., logical-to-physical memory address mapping table, also referred to herein as a logical-to-physical (L2P) mapping table (referred to as an L2P table), data from logging, scratch pad data, and so forth).

A memory device can be a non-volatile memory device. A non-volatile memory device is a package of one or more die. Each die can be comprised of one or more planes. For some types of non-volatile memory devices (e.g., AND-type devices), each plane is comprised of a set of physical blocks. For some memory devices, blocks are the smallest area that can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which are raw memory devices combined with a local embedded controller for memory management within the same memory device package. The memory device can be divided into one or more zones where each zone is associated with a different set of host data or user data or application.

Certain memory devices, such as NAND-type memory devices, include one or more blocks, (e.g., multiple blocks), with each of those blocks including multiple memory cells. For instance, a memory device can include multiple pages (stored across one or more word lines (WLs)), with each page including a subset of memory cells of the memory device. A threshold voltage (VT) of a memory cell (of a block) can be the voltage at which the floating gate (e.g., NAND transistor), implementing the memory cell, turns on and conducts (e.g., to a bit line coupled to the memory cell).

Generally, writing data to such memory devices involves programming (by way of a program operation) the memory devices at the page level of a block, and erasing data from such memory devices involves erasing the memory devices at the block level (e.g., page level erasure of data is not possible).

Solid-state drive (SSD) manufacturers usually rigorously test and validate performance and reliability of the SSDs (e.g., NAND-type memory devices) throughout the entire lifecycle, including EOL conditions. Comprehensive performance measurements at both beginning-of-life (BOL) and EOL may need to be performed to ensure the SSDs meet specified performance targets and maintain acceptable degradation levels. In some cases, the specifications may require validation that SSD performance degradation does not exceed 5% at EOL compared to BOL performance, while still meeting all declared specification values.

Conventional approaches to EOL testing face significant technical limitations that make the process extremely time and resource intensive. With increasing drive capacities reaching up to 32 TB and limited system throughput capabilities, cycling a drive to EOL (e.g., 10,000 program-erase cycles) in order to perform the requisite measurements to ensure the SSD is reliable can take a very long time (e.g., over 470 days) using normal cycling methods. Certain conventional approaches utilize "short stroke" testing, which cycles only a fraction (e.g., 10%) of the capacity of the SSD. This can reduce testing time but can fail to properly validate critical drive behaviors as the entire SSD is not subjected to testing. This approach does not accurately represent the full characteristics of the SSD since media management algorithms are impacted differently when only a portion of the SSD is cycled.

These inefficiencies create significant challenges for manufacturers trying to meet specifications for EOL validation. The lengthy cycling times delay product qualification and market readiness, while incomplete testing methodologies risk missing critical performance issues. Additionally, the inability to properly validate media management algorithms like background scanning and refresh operations at EOL conditions leaves potential reliability concerns unaddressed.

The present disclosure addresses these inefficiencies by implementing a fast-cycling feature or mode that operates in a standalone mode to accelerate PEC of the entire memory sub-system (e.g., SSD). This can enable reaching the EOL of the SSD at a substantially faster rate than conventional approaches, such as by reaching the EOL approximately 250 times faster compared to conventional approaches. The disclosed system applies adjusted (or optimized) program and erase (e.g., trim) settings and drive configurations that enable comprehensive EOL testing while maintaining voltage threshold distributions and performance characteristics that match normal cycling conditions. By utilizing specialized commands (e.g., vendor-specific (VS) commands) and coordinated channel processors, the disclosed system achieves rapid PEC cycling while ensuring proper validation of media management algorithms and maintaining performance degradation within specified thresholds. The disclosed approach reduces or eliminates the limitations of short stroke testing by enabling full-drive cycling validation while reducing the testing time, which significantly improves product qualification efficiency and reliability assessment.

In some examples, a memory sub-system is provided that includes a set of memory devices and a processing device operatively coupled to the memory devices. The processing device receives a fast-cycling start command (e.g., from a host) to initiate a fast-cycling mode that accelerates PEC of memory blocks to an EOL condition defined by a threshold number of PECs. Upon receiving this command, the processing device enables a standalone mode for each of the memory devices of the memory sub-system that prevents servicing of host input/output requests.

In some cases, the memory sub-system includes channel processors coupled between the processing device and memory devices. When the fast-cycling mode is initiated, the processing device adjusts program and erase voltage settings used by the channel processors. These adjusted settings are determined through a calibration process that obtains both normal operating voltage settings and EOL voltage settings, then computes optimal fast-cycling voltages by minimizing differences in voltage threshold distributions between normal and EOL operation.

To determine the EOL voltage settings, the processing device first configures an individual channel processor to perform accelerated cycling on a test memory device until reaching the EOL condition. The resulting voltage settings from this characterization are used as a baseline for computing the fast-cycling parameters.

In some examples, when enabling standalone mode, the processing device stores the current device status, verifies an idle state, and preserves media management parameters. The processing device maintains a fast-cycling status variable tracked by the processing device, which can include a front-end (FE) processor, that indicates the cycling status of each channel processor. This variable is updated when fast-cycling operations begin on a channel processor and again when that channel processor completes cycling its associated memory devices. The processing device supports status check commands that return the current state of this variable.

During fast-cycling, media management operations like background scanning, refresh operations, and media scans are temporarily disabled. When fast-cycling completes, a cleanup command restores the device to normal operation by setting appropriate PEC values based on the EOL condition and re-enabling media management with parameters tuned for EOL operation.

The threshold PEC count that defines EOL can be set to 10,000 cycles or any other suitable value that is associated with EOL conditions. The processing device is designed to work with three-dimensional (3D) NAND devices. This approach can be implemented through both hardware systems and software instructions stored on non-transitory machine-readable media.

Though various examples are described herein as being implemented with respect to a memory sub-system (e.g., a controller of the memory sub-system), some or all of the portions of an example can be implemented with respect to a host system, such as a software application or an operating system of the host system.

FIG. 1 illustrates an example computing system 100 that includes a memory sub-system 110, in accordance with some examples. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, a secure digital (SD) card, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some examples, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., a peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a compute express link (CXL) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory devices 130, 140 when the memory sub-system 110 is coupled with the host system 120 by the PCIe or CXL interface. The physical host interface can provide an interface for passing control, address, data, and other signals between the memory sub-system 110 and the host system 120.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a NAND type flash memory and write-in-place memory, such as a 3D cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional (2D) NAND and 3D NAND.

Each of the memory devices 130, 140 can include one or more arrays of memory cells. One type of memory cell, for example, single level cells (SLCs), can store one bit per cell. Other types of memory cells, such as multi-level cells (MLCs), tri-level cells (TLCs), quad-level cells (QLCs), and penta-level cells (PLCs), can store multiple bits per cell. In some examples, each of the memory devices 130, 140 can include one or more arrays of memory cells such as SLCs, MLCs, TLCs, QLCs, or any combination of such. In some examples, a particular memory device can include an SLC portion, and an MLC portion, a TLC portion, or a QLC portion of memory cells. The memory cells of the memory devices 130, 140 can be grouped as pages that can refer to a logical unit of the memory device used to store data. With some types of memory (e.g., NAND), pages can be grouped to form blocks or BSs. As used herein, a block including SLCs can be referred to as a SLC block, a block including MLCs can be referred to as a MLC block, a block including TLCs can be referred to as a TLC block, and a block including QLCs can be referred to as a QLC block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide-based RRAM (OxRAM), negative-or (NOR) flash memory, and electrically erasable programmable read-only memory (EEPROM).

A memory sub-system controller 115 (or controller 115 for simplicity) can communicate with the memory devices 130, 140 to perform operations such as reading data, writing data, or erasing data (e.g., performing GC operations) at the memory devices 130, 140 and other such operations. The memory sub-system controller 115 can include hardware such as one or more integrated circuits and/or discrete components, a buffer memory, or a combination thereof. The hardware can include digital circuitry with dedicated (e.g., hard-coded) logic to perform the operations described herein. The memory sub-system controller 115 can be a microcontroller, special purpose logic circuitry (e.g., a field programmable gate array (FPGA), an application specific integrated circuit (ASIC), and so forth), or other suitable processor.

The memory sub-system controller 115 can include a processor (processing device 117) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some examples, the local memory 119 can include memory registers storing memory pointers, fetched data, and so forth. The local memory 119 can also include ROM for storing micro-code. While the example memory sub-system 110 in FIG. 1 has been illustrated as including the memory sub-system controller 115, in another example, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, GC operations, error detection and ECC operations, encryption operations, caching operations, and address translations between a logical address (e.g., LBA, namespace) and a physical memory address (e.g., physical block address in a physical address space of the memory device 130 or memory device 140) that are associated with the memory devices 130, 140. The memory sub-system controller 115 can further include host interface circuitry to communicate with the host system 120 via the physical host interface. The host interface circuitry can convert the commands received from the host system 120 into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some examples, the memory sub-system 110 can include a cache or buffer (e.g., DRAM) and address circuitry (e.g., a row decoder and a column decoder) that can receive an address from the memory sub-system controller 115 and decode the address to access the memory devices 130, 140.

In some examples, the memory device 130 includes local media controllers 135 that operate in conjunction with memory sub-system controller 115 to execute operations on one or more memory cells of the memory device 130. An external controller (e.g., memory sub-system controller 115) can externally manage the memory device 130 (e.g., perform media management operations on the memory device 130). In some examples, a memory device 130 is a managed memory device, which is a raw memory device combined with a local controller (e.g., local media controller 135) for media management within the same memory device package. An example of a managed memory device is a managed NAND (mNAND) device. Any operation discussed as being performed by the memory sub-system controller 115 can be similarly performed by the local media controllers 135 and vice versa.

The memory sub-system controller 115 can be coupled to a set of channel processors, such as channel processor 113 and channel processor 142. Each channel processor in the set of channel processors can be coupled to a corresponding group of memory devices. For example, the channel processor 113 can be coupled to control the memory device 140, and the channel processor 142 can be coupled to control the memory device 130. The memory device 140 can include a single memory device or multiple memory devices. Similarly, the memory device 130 can include a single memory device or multiple memory devices. Together, the memory device 140 and the memory device 130 make up all of the memory devices of the memory sub-system 110.

The set of channel processors (e.g., channel processor 113 and channel processor 142) serve as intermediary controllers between the memory sub-system controller 115 and the memory devices (e.g., memory device 140 and memory device 130). Each channel processor can manage operations for its assigned group of memory devices. The channel processors receive commands from the front-end/CPU (e.g., processing device 117 or processor) and translate these into specific program, erase, and read operations for their connected memory dies or memory devices.

In some configurations, the memory sub-system 110 includes multiple channel processors (e.g., 16 channels), with each channel processor being responsible for controlling one or more memory dies attached to that channel. The channel processors handle the detailed timing and voltage control associated with memory operations, including applying TRIM settings and program/erase voltages to each die on their respective channels. During fast-cycling operations, the channel processors work in coordination with the memory sub-system controller 115 to execute accelerated program-erase cycling. The set of channel processors receive fast-cycling requests from the FE processor, apply adjusted TRIM settings to their assigned memory dies, execute the cycling operations, and report completion status back to the FE processor. The set of channel processors also manage the restoration of normal TRIM settings based on target program-erase counts once fast-cycling is complete.

In some examples, the memory sub-system controller 115 communicates with the channel processor 113 and channel processor 142 to perform fast-cycling operations. When a fast-cycling start command is received (e.g., from the host system 120), the memory sub-system controller 115 enables a standalone mode that prevents servicing of host I/O requests and configures the set of channel processors (e.g., channel processor 113 and channel processor 142) to apply adjusted program and erase voltage settings (e.g., TRIM settings) to their corresponding memory devices. The set of channel processors apply these adjusted TRIM settings to accelerate program-erase cycling while maintaining voltage threshold distributions similar to normal cycling conditions.

During fast-cycling operations, the memory sub-system controller 115 maintains a fast-cycling status variable that tracks the cycling progress of each channel processor. This variable is updated when fast-cycling begins on a channel processor and again when that channel processor completes cycling its associated memory devices. The channel processors coordinate to cycle their respective memory devices, while ensuring the voltage threshold distributions and performance characteristics match those achieved through normal cycling.

Once all channel processors report completion, the memory sub-system controller 115 processes a cleanup command (e.g., received from the host system 120) to restore normal operation parameters and re-enable media management functions that were temporarily disabled during fast-cycling.

Figure 2:
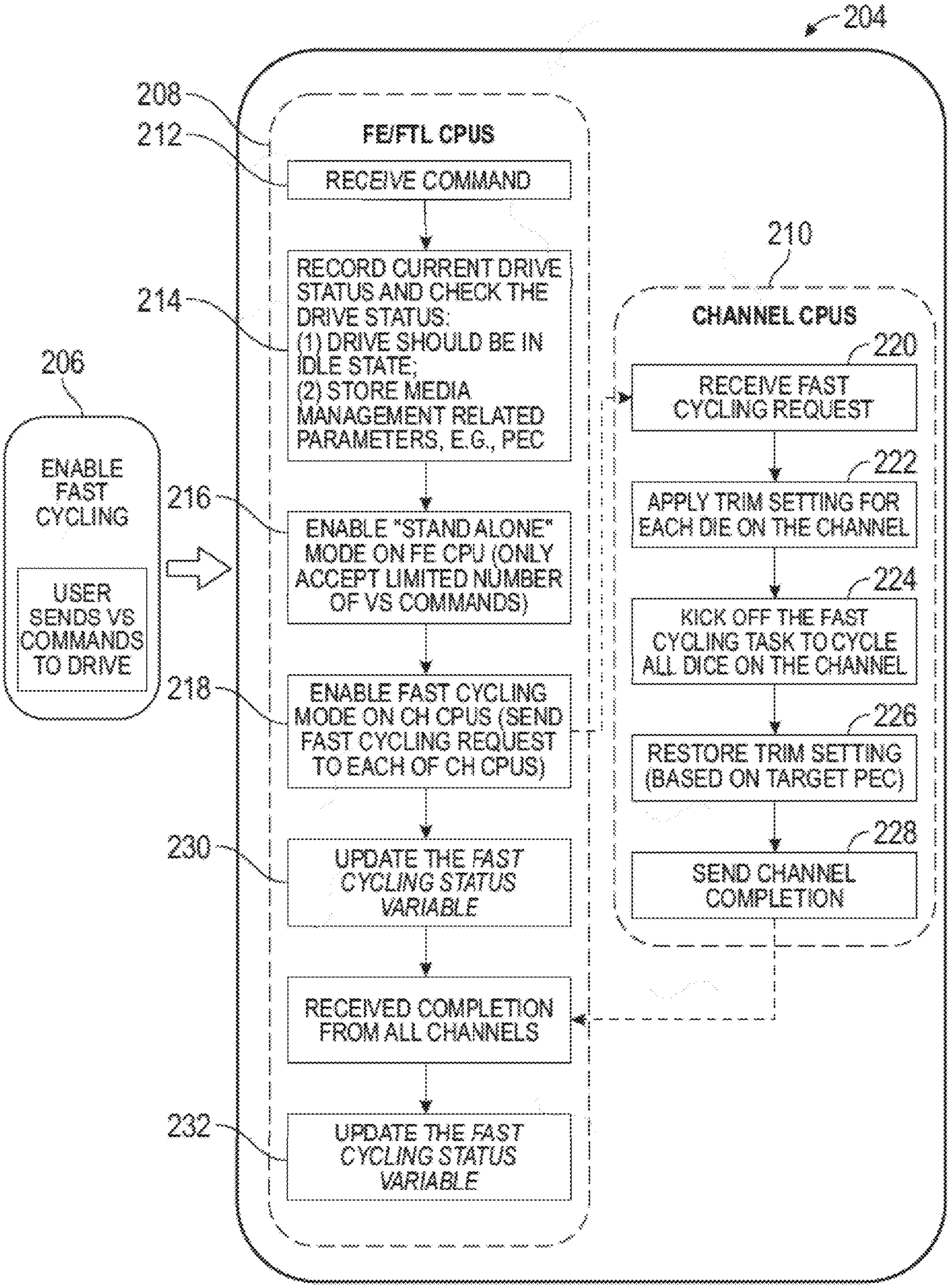
FIG. 2 illustrates a flow diagram of fast-cycling mode operations, in accordance with some examples.

FIG. 2 illustrates a flow diagram 204 of fast-cycling mode operations, in accordance with some examples. Specifically, the flow diagram 204 begins or is initiated when a user (e.g., via the host system 120) initiates fast-cycling by sending the fast-cycling start command from the host system 120 to the memory sub-system 110 (e.g., to the memory sub-system controller 115) at host operation 206.

The memory sub-system controller 115 performs FE operations 208 in response to receiving the fast-cycling start command from the host system 120. Specifically, the memory sub-system controller 115 can receive the command at operation 212 and begins coordinating parallel operations between the set of channel processors, such as the channel processor 113 and the channel processor 142.

The memory sub-system controller 115 first stores the current drive status and verifies the drive is in an idle state before enabling standalone mode at operation 214. Storing the current drive status and verifying idle state are important steps that may be performed before enabling the standalone mode for the memory sub-system 110. Namely, the drive (e.g., the memory sub-system 110) may need to be in an idle state (not processing any host I/O requests) to ensure data integrity and prevent corruption during the fast-cycling process. Since fast-cycling mode disables all host I/O operations, any in-progress operations may need to be completed before entering standalone mode.

The memory sub-system controller 115 may store two key types of parameters before entering standalone mode. The memory sub-system controller 115 can store the current drive status, such as the current program-erase count (PEC) values of each memory device or memory block, which track how many program-erase cycles each memory block has undergone. This information may need to be preserved to maintain accurate wear leveling data after fast-cycling completes. Media management parameters may also be stored to control important maintenance functions like background scanning and refresh operations. These parameters may also need to be stored so they can be properly restored with EOL-appropriate values when returning to normal operation mode.

The idle state verification and parameter storage are important because, once standalone mode is enabled, the memory sub-system 110 will only accept a limited set of vendor-specific commands and will reject all normal host I/O requests. This complete isolation from host operations may be necessary to achieve the accelerated cycling speeds, but may require preservation of the drive's operational state to ensure proper functionality when normal operations resume.

After the memory sub-system controller 115 performs the operation 214, the memory sub-system controller 115 enables the stand-alone mode on the memory sub-system controller 115 at operation 216. Once the memory sub-system controller 115 is in the stand-alone mode, the memory sub-system controller 115 may only service and accept VS commands from the host system 120 and reject all other input-output (I/O) commands from the host system 120.

Once standalone mode is enabled, the memory sub-system controller 115 sends fast-cycling requests to the set of channel processors, such as to both channel processor 113 and channel processor 142 to begin parallel fast-cycling operations on their respective memory devices at operation 218. Each channel processor in the set of channel processors can perform the channel processor operations 210.

For example, channel processor 113 can receive the fast-cycling request at operation 220 and can begin applying adjusted TRIM settings to memory device 140 at operation 222, while simultaneously channel processor 142 applies adjusted TRIM settings to memory device 130. In some cases, the set of channel processors can receive the values for the adjusted TRIM settings to use from the memory sub-system controller 115.

Figure 3:
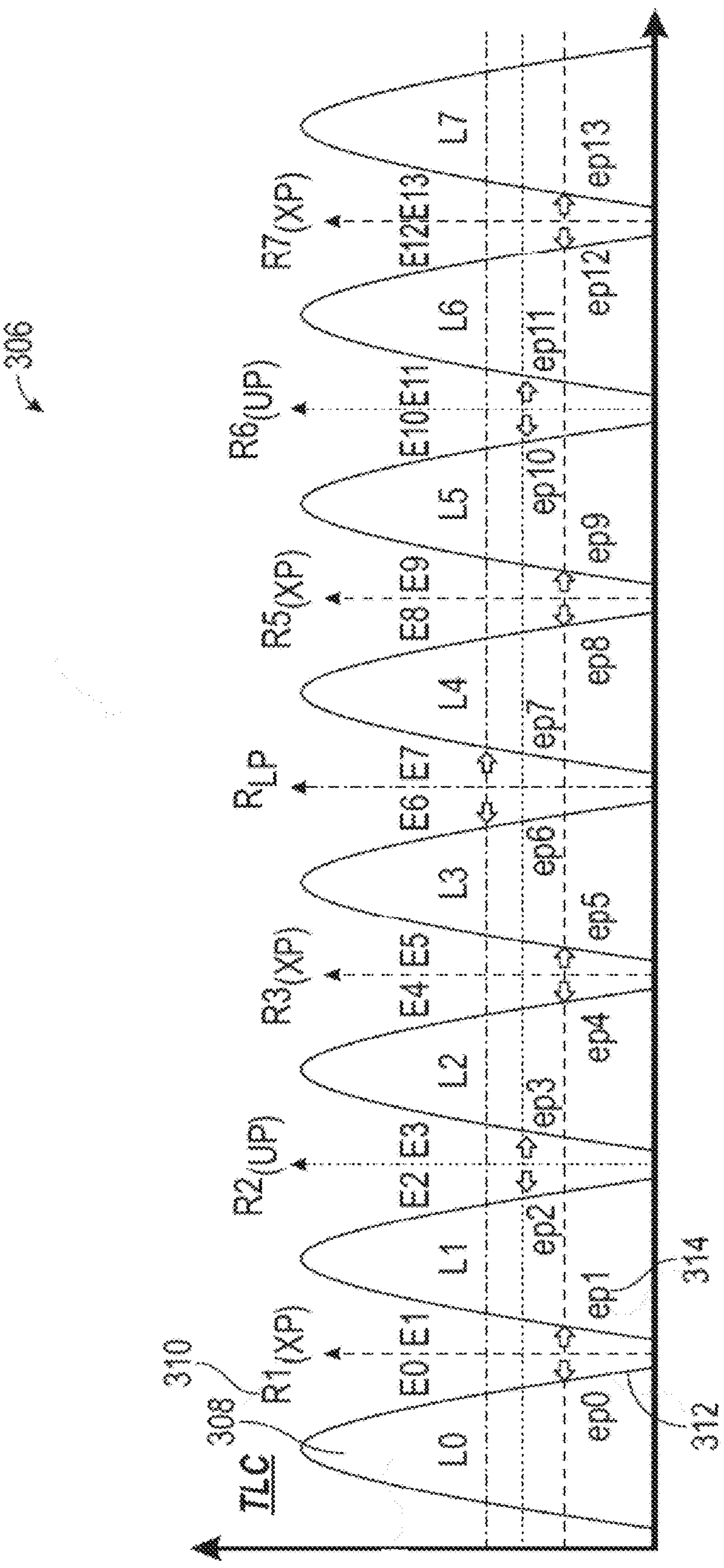
FIG. 3 illustrates a program and erase voltage distribution, in accordance with some examples.

The memory sub-system controller 115 can generate the adjusted TRIM settings through a multi-objective optimization process shown in FIG. 3. As illustrated in a program and erase voltage distribution 306, the memory sub-system controller 115 can first generate the program and erase voltage distribution 306 corresponding to normal or nominal program and erase voltage settings that produce the baseline voltage threshold distributions. The memory sub-system controller 115 can then instruct a particular channel processor to perform fast-cycling on a specific set of memory devices. Once that fast-cycling completes, the memory sub-system controller 115 obtains the EOL program and erase voltage distribution 306 of the memory devices. The memory sub-system controller 115 can determine optimal fast-cycling voltage settings by analyzing the program and erase voltage distribution 306 associated with BOL and the program and erase voltage distribution 306 associated with EOL.

Specifically, the memory sub-system controller 115 can identify valley positions between voltage levels (ep0-ep13 shown in FIG. 3). For each voltage level pair (e.g., the first valley position 312 and the second valley position 314), the memory sub-system controller 115 calculates the midpoint position (e.g., (ep0+ep1)/2) (e.g., a middle valley position 310 for the first level 308). The memory sub-system controller 115 identifies the middle valley position 310 for each level of the program and erase voltage distribution 306 corresponding to the normal BOL condition. The memory sub-system controller 115 can also identify the middle valley position 310 for each level of the program and erase voltage distribution 306 corresponding to the EOL condition. The memory sub-system controller 115 compares these positions between normal cycling and fast-cycling distributions. Using these comparisons, the memory sub-system controller 115 applies a mathematical optimization to minimize the differences in valley positions between normal and fast-cycling voltage distributions. This optimization uses an L2-norm (Euclidean norm) calculation to find program and erase voltage settings that produce the most similar distributions. These are stored and used as the adjusted TRIM settings.

The adjusted TRIM settings are then provided to the channel processors (channel processor 113 and channel processor 142) to apply to their respective memory devices. The channel processors maintain these adjusted voltage settings throughout the fast-cycling process until reaching the target program-erase count, at which point they restore normal voltage settings based on the EOL condition. This careful calibration of voltage settings by memory sub-system controller 115 ensures that while the cycling speed is accelerated, the voltage threshold distributions remain similar to those produced during normal cycling operations. This maintains comparable endurance behavior and performance characteristics between fast-cycling and normal cycling approaches.

Referring back to FIG. 2, in some cases, the memory sub-system controller 115 maintains a fast-cycling status variable that tracks the independent progress of each channel processor. For example, when the channel processor 113 begins cycling memory device 140, the memory sub-system controller 115 updates the status in the variable associated with the channel processor 113 to indicate that the channel processor 113 is currently performing fast-cycling of the corresponding memory devices. Similarly, the channel processor 142 updates its own status in the variable stored by the memory sub-system controller 115 when the channel processor 142 begins cycling memory device 130, allowing the memory sub-system controller 115 to monitor both operations independently.

Each channel processor executes fast-cycling tasks on its assigned memory dies by applying the adjusted (or optimized) program and erase voltage settings that were determined through the calibration process (discussed in connection with FIG. 2). The channel processors work in parallel to cycle their respective memory devices. For example, the channel processor 113 can perform operation 224 to trigger and perform the fast-cycling operations to cycle all of the associated memory devices coupled to the channel processor 113 to the EOL. At that point, the channel processor 113 can perform operation 226 to restore the TRIM settings to the voltage values associated with the current PEC of each memory device or memory block.

Throughout the process, the memory sub-system controller 115 continuously monitors the fast-cycling status variable to track the progress of both channel processor 113 and channel processor 142 at operation 230. When channel processor 113 completes cycling memory device 140 to the target PEC (e.g., 10,000 PEC), the channel processor 113 sends a completion status to the memory sub-system controller 115, which updates the status in the variable corresponding to the channel processor 113. Similarly, when channel processor 142 finishes cycling memory device 130, the channel processor 142 independently sends its completion status at operation 228 and updates the variable associated with the channel processor 142 at operation 232.

The memory sub-system controller 115 verifies through the status variable that both channel processors have completed their cycling operations before proceeding. After confirming completion from all of the set of channel processors, the memory sub-system controller 115 begins restoring the TRIM settings on each channel processor based on the target program-erase count.

The memory sub-system controller 115 then updates the final status in the variable to indicate successful completion of fast-cycling across all channels. During the entire parallel operation, media management functions remain disabled on both channels to allow for maximum cycling efficiency. The standalone mode ensures no host I/O requests interfere with either channel processor during their independent cycling operations.

This parallel architecture enables the system to achieve accelerated cycling across multiple memory devices simultaneously while maintaining proper voltage threshold distributions. The status variable provides granular tracking of each channel processor's progress, ensuring reliable coordination of the parallel operations. The completion of fast-cycling is only confirmed when both channel processor 113 and channel processor 142 have independently reported successful cycling of their respective memory devices.

Figure 4:
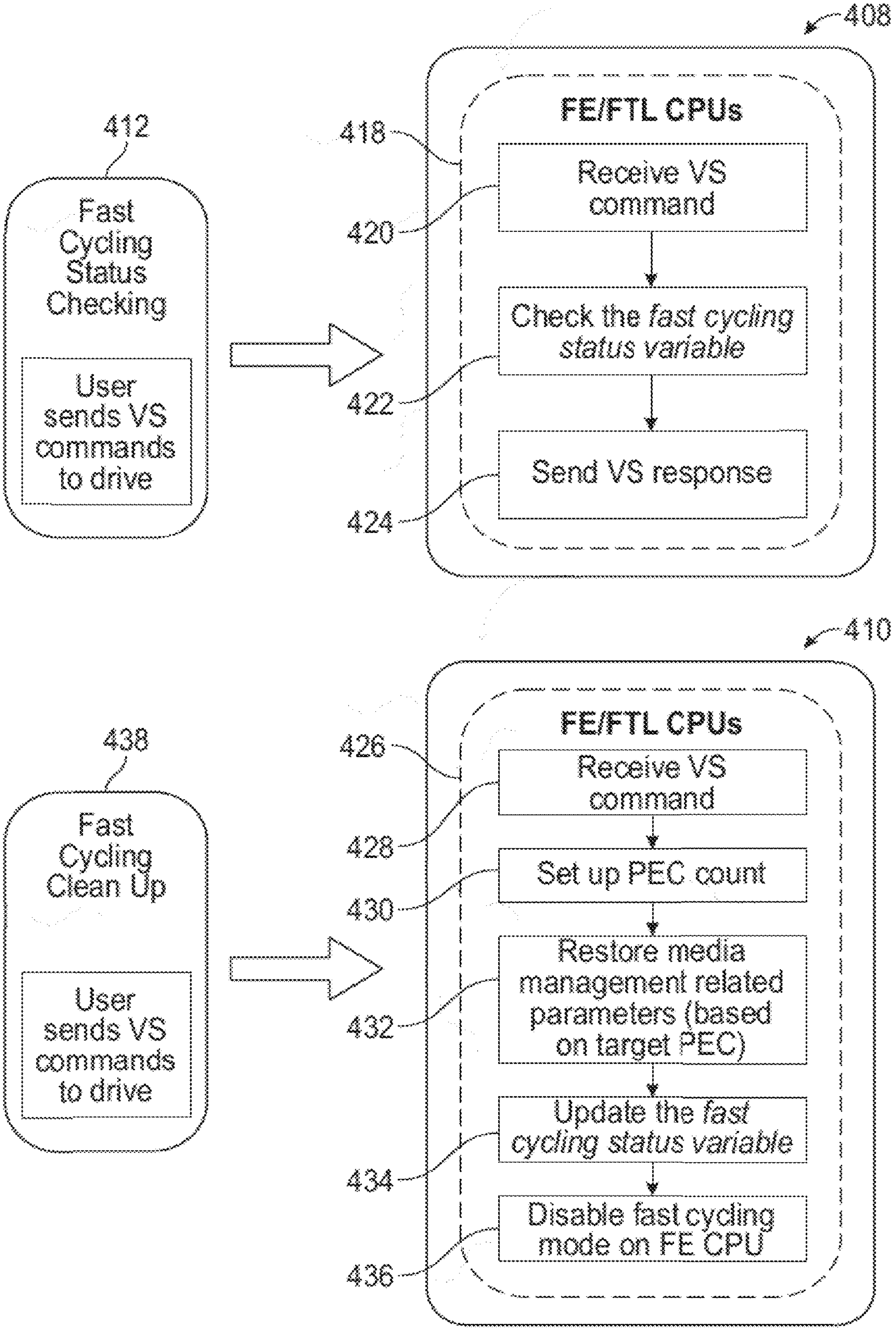
FIG. 4 illustrates flow diagrams of fast-cycling mode operations, in accordance with some examples.

FIG. 4 illustrates flow diagrams of fast-cycling mode operations, in accordance with some examples. Specifically, FIG. 4 illustrates two key operational flows for managing fast-cycling mode including operations shown in the status check flow diagram 408 and the clean up flow diagram 410.

The status check flow diagram 408 operations are initiated in response to receiving, from the host system 120, a fast-cycling status check at host operation 412. In such cases, the host system 120 sends a VS commands to the memory sub-system 110 requesting a status check to be performed. The memory sub-system controller 115 performs the FE operations 418 in which the status check command is received at operation 420.

The memory sub-system controller 115 then checks the fast-cycling status variable at operation 422 to determine the current state of fast-cycling operations across all channel processors. Based on this check, the memory sub-system controller 115 sends a VS response at operation 424 indicating whether fast-cycling is in progress, completed, or has encountered errors. The VS response can be provided on a memory device granularity, a channel processor granularity, and/or on the memory sub-system 110 granularity.

The clean up flow diagram 410 operations are initiated in response to receiving, from the host system 120, a fast-cycling clean up command at host operation 438. The memory sub-system controller 115 performs FE operations 426 where the VS command is received at operation 428 to begin the cleanup process. At operation 430, the memory sub-system controller 115 sets up the PEC based on the completed fast-cycling operations. Then, the memory sub-system controller 115 performs operation 432 to restore the media management related parameters based on the target PEC value that was achieved during fast-cycling.

For example, the memory sub-system controller 115 can maintain a table that tracks the PEC for each memory device controlled by the channel processors 113 and 142. When a channel processor completes cycling operations on its assigned memory devices, it reports the final PEC values to memory sub-system controller 115, which stores these values in the table. During the cleanup operation 430, the memory sub-system controller 115 uses this PEC table to properly configure the media management parameters for each memory device based on its specific PEC. This ensures that parameters like background scanning frequency and refresh thresholds are optimized for each device's actual wear level rather than using a one-size-fits-all approach. The memory sub-system controller 115 maintains this granular PEC tracking throughout the fast-cycling process to enable precise media management tuning when returning to normal operation mode.

The memory sub-system controller 115 then updates the fast-cycling status variable at operation 434 to reflect that cleanup is in progress. Finally, at operation 436, the memory sub-system controller 115 disables fast-cycling mode on the memory sub-system 110, returning the memory sub-system 110 to normal operation where I/O requests and commands from the host system 120 can start to be serviced by the memory sub-system 110.

This cleanup process ensures proper restoration of the memory sub-system controller 115's operational parameters after fast-cycling completes. The status variable maintained by the memory sub-system controller 115 provides tracking of the fast-cycling state across channel processors 113 and 142.

When resuming normal operations after fast-cycling, the channel processors 113 and 142 restore their program and erase voltage settings based on the actual PEC achieved during fast-cycling rather than continuing to use the accelerated adjusted voltage settings. The memory sub-system controller 115 maintains a table tracking the PEC values for each memory device, and uses these values to configure the appropriate voltage settings that correspond to normal operation at that wear level.

For example, if a memory device has reached 10,000 PECs through fast-cycling, the channel processor can apply the normal program and erase voltages that correspond to a device at 10,000 PECs, not the adjusted voltages used during fast-cycling. This ensures that during normal operation, the memory devices operate with voltage settings optimized for their actual wear state while maintaining the same voltage threshold distributions and performance characteristics as a normally-cycled device.

The restoration of normal voltage settings occurs during the cleanup operation when the channel processors receive the command to restore TRIM settings based on the target PEC values. This process ensures that while fast-cycling achieved accelerated aging through specialized voltage settings, normal operations proceed with voltages appropriate for reliable operation at the device's actual program-erase count.

Figure 5:
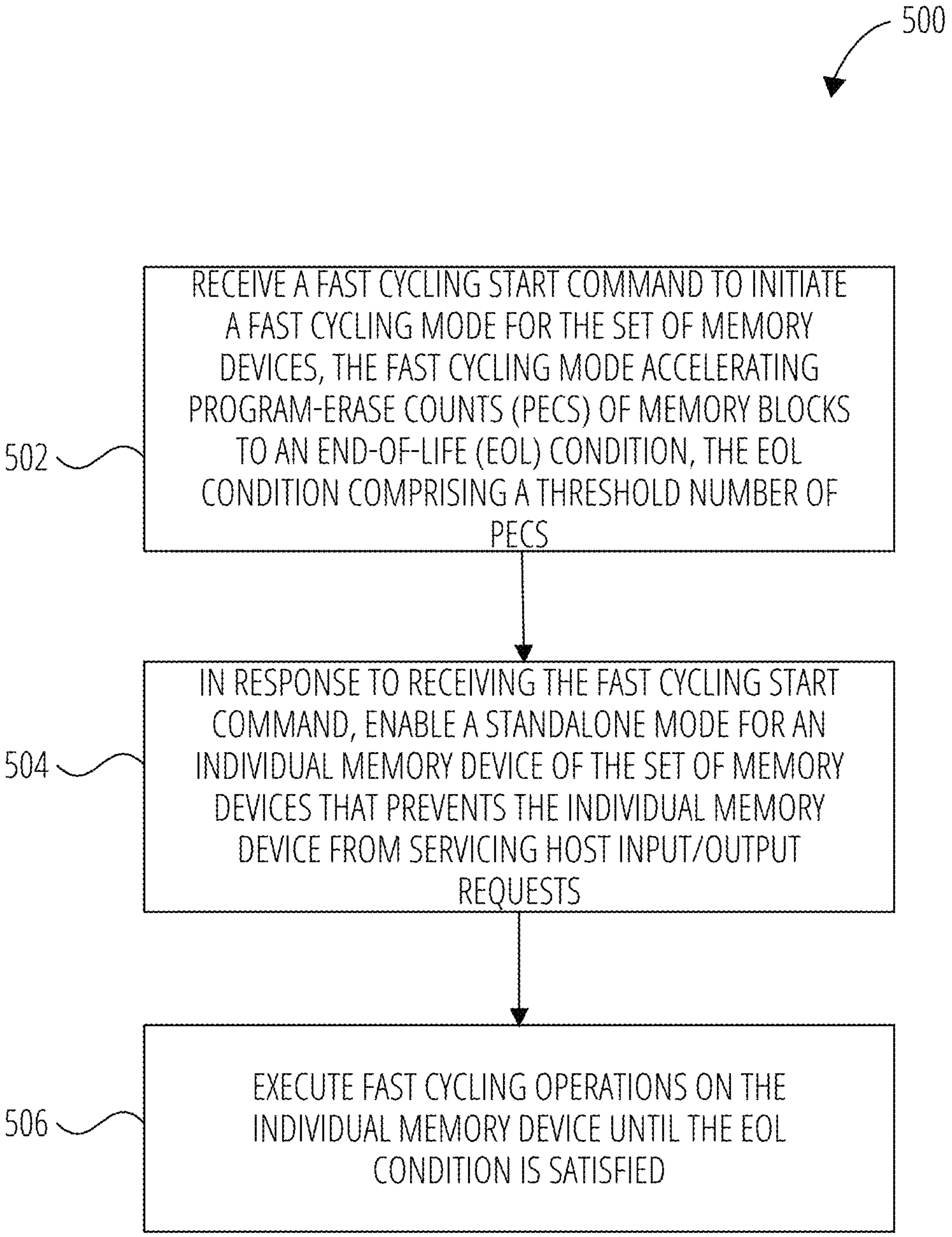
FIG. 5 illustrates a flow diagram of fast-cycling mode operations, in accordance with some examples.

FIG. 5 illustrates a flow diagram 500 of fast-cycling mode operations, in accordance with some examples. The process can be implemented through various forms of processing logic, including hardware components (such as processing devices, dedicated logic circuits, programmable logic, microcode, or integrated circuits), software instructions executed on a processing device, or combinations thereof. The memory sub-system controller 115 or its subcomponents can perform these operations, with the channel processor 113 handling key aspects of the process.

The flow diagram 500 begins at operation 502, where the memory sub-system controller 115 receives a fast-cycling start command to initiate a fast-cycling mode for the set of memory devices, the fast-cycling mode accelerating PECs of memory blocks to an EOL condition, the EOL condition including a threshold number of PECs. Then, at operation 504, the memory sub-system controller 115, in response to receiving the fast-cycling start command, enables a standalone mode for an individual memory device of the set of memory devices that prevents the individual memory device from servicing host input/output requests and, at operation 506, the memory sub-system controller 115 executes fast-cycling operations on the individual memory device until the EOL condition is satisfied.

Figure 6:
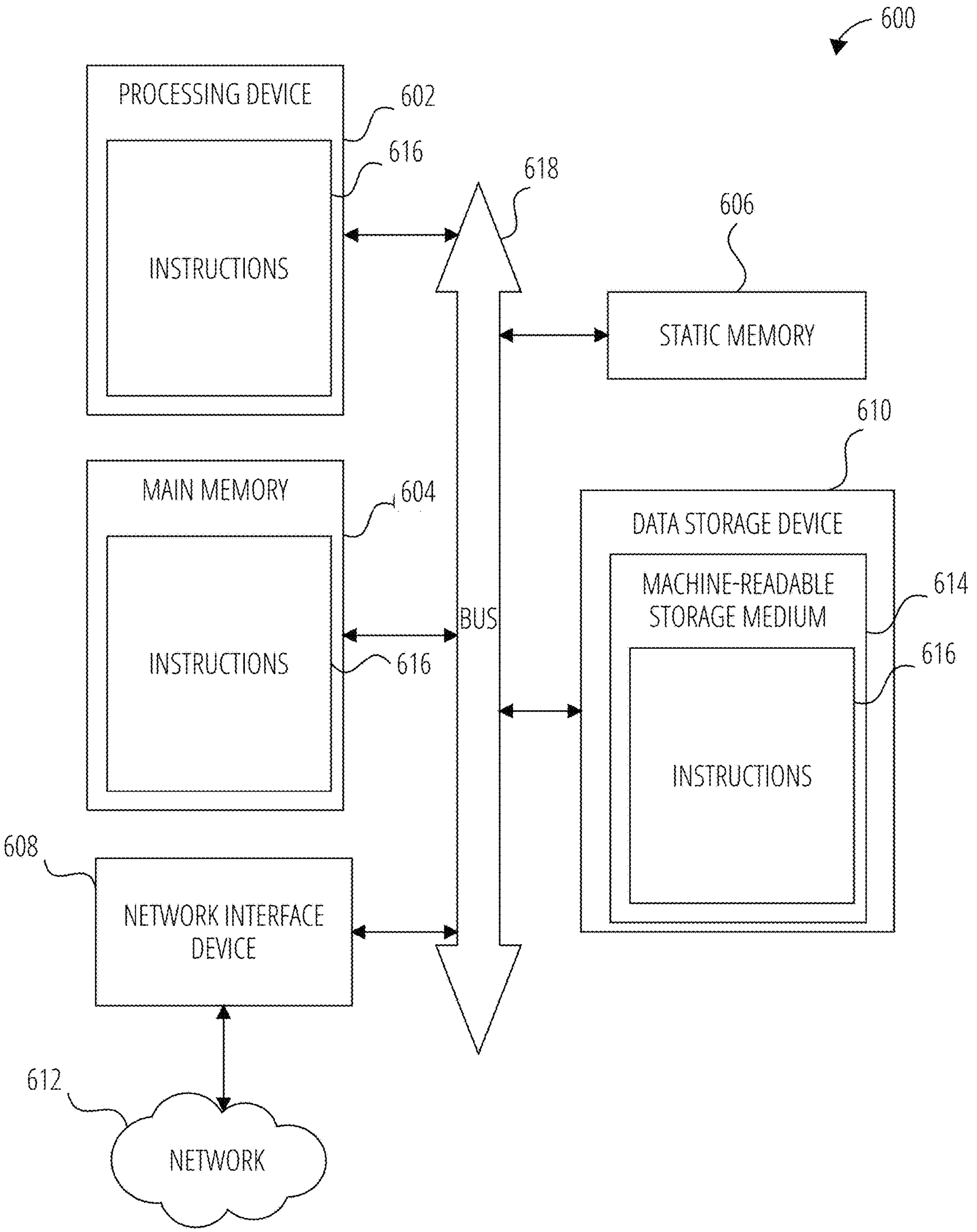
FIG. 6 is a block diagram of an example computer system, according to some examples.

FIG. 6 illustrates an example machine in the form of a computer system 600 within which a set of instructions can be executed for causing the machine to perform any one or more of the methodologies discussed herein. In some examples, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations described herein. In alternative examples, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., ROM, flash memory, DRAM such as SDRAM or Rambus DRAM (RDRAM), etc.), a static memory 606 (e.g., flash memory, static random access memory (SRAM), etc.), and a data storage device 610, which communicate with each other via a bus 618.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application-specific integrated circuit (ASIC), a field programmable gate array (FPGA), a digital signal processor (DSP), a network processor, or the like. The processing device 602 is configured to execute instructions 616 for performing the operations and steps discussed herein. The computer system 600 can further include a network interface device 608 to communicate over a network 612.

The data storage device 610 can include a machine-readable storage medium 614 (also known as a computer-readable medium) on which is stored one or more sets of instructions 616 or software embodying any one or more of the methodologies or functions described herein. The instructions 616 can also reside, completely or at least partially, within the main memory 604 and/or within the processing device 602 during execution thereof by the computer system 600, the main memory 604 and the processing device 602 also constituting machine-readable storage media. The machine-readable storage medium 614, data storage device 610, and/or main memory 604 can correspond to the memory sub-system 110 of FIG. 1.

In one example, the instructions 616 include instructions to implement functionality corresponding to providing block failure protection for a zone memory sub-system as described herein (e.g., the channel processor 113 of FIG. 1). While the machine-readable storage medium 614 is shown in an example to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Described implementations of the subject matter can include one or more features, alone or in combination as illustrated below by way of examples.

Example 1. A system comprising: a set of memory devices; and a processing device, operatively coupled to the set of memory devices, programmed to perform operations comprising: receiving a fast-cycling start command to initiate a fast-cycling mode for the set of memory devices, the fast-cycling mode accelerating program-erase counts (PECs) of memory blocks to an end-of-life (EOL) condition, the EOL condition comprising a threshold number of PECs; in response to receiving the fast-cycling start command, enabling a standalone mode for an individual memory device of the set of memory devices that prevents the individual memory device from servicing host input/output requests; and executing fast-cycling operations on the individual memory device until the EOL condition is satisfied.

Example 2. The system of Example 1, comprising: a set of channel processors coupled to the processing device and the set of memory devices, the operations comprising: adjusting program and erase voltage settings used by the set of channel processors to program and erase data blocks of the set of memory devices in response to receiving the fast-cycling start command; and performing fast-cycling of the set of memory devices using the adjusted program and erase voltage settings.

Example 3. The system of Example 2, the operations comprising: obtaining normal program and erase voltage settings for the set of channel processors; obtaining EOL program and erase voltage settings; and computing the adjusted voltage settings by minimizing differences in voltage threshold distributions between the EOL program and erase voltage settings and the normal program and erase voltage settings.

Example 4. The system of Example 3, wherein the EOL program and erase voltage settings is obtained by: configuring an individual channel processor to perform fast-cycling of a first memory device of the set of memory devices until the EOL condition is satisfied; and in response to determining that the EOL condition is satisfied, determining the EOL program and erase voltage settings associated with the first memory device.

Example 5. The system of any one of Examples 1-4, wherein enabling the standalone mode comprises: storing a current status of the individual memory device; verifying the individual memory device is in an idle state; and storing media management parameters of the individual memory device.

Example 6. The system of any one of Examples 1-5, wherein the operations further comprise: receiving a status check command; and providing a status indicating whether fast-cycling operations are in progress, completed, or have errors in response to receiving the status check command.

Example 7. The system of any one of Examples 1-6, wherein the operations further comprise: receiving a cleanup command; and restoring the individual memory device to normal operation mode in response to receiving the cleanup command.

Example 8. The system of Example 7, wherein restoring the individual memory device comprises: setting PECs of the individual memory device based on the EOL condition; and restoring media management parameters for the individual memory device.

Example 9. The system of any one of Examples 7-8, wherein the operations further comprise: disabling media management operations on the set of memory devices during fast-cycling.

Example 10. The system of Example 9, the media management operations comprising at least one of background scanning of memory blocks, refresh operations, and/or media scan operations.

Example 11. The system of any one of Examples 1-10, wherein the operations further comprise: maintaining a fast-cycling status variable that indicates a cycling status for each channel processor of a set of channel processors, each channel processor being associated with a respective group of memory devices of the set of memory devices.

Example 12. The system of Example 11, wherein maintaining the fast-cycling status variable comprises: updating the fast-cycling status variable in response to initiating fast-cycling operations on an individual channel processor of the set of channel processors; and updating the fast-cycling status variable in response to receiving an indication from the individual channel processor that fast-cycling operations on the group of memory device associated with the individual channel processor have been completed.

Example 13. The fast-cycling status variable of Example 12, wherein the operations further comprise: receiving a status check command; and providing a response indicating a current state of the fast-cycling status variable.

Example 14. The fast-cycling status variable of any one of Examples 12-13, wherein: the fast-cycling status variable is maintained by a front-end (FE) processor comprising the processing device; and each channel processor sends a completion status to the FE processor upon completing fast-cycling operations on its corresponding group of memory dies.

Example 15. The system of any one of Examples 1-14, wherein the threshold number of PECs is 10,000 or more.

Example 16. The system of any one of Examples 1-15, wherein the memory device comprises a three-dimensional (3D) NAND device.

Example 17. At least one non-transitory machine-readable storage medium comprising instructions that, when executed by a processing device, cause the processing device to perform operations comprising: receiving a fast-cycling start command to initiate a fast-cycling mode for a set of memory devices, the fast-cycling mode accelerating program-erase counts (PECs) of memory blocks to an end-of-life (EOL) condition, the EOL condition comprising a threshold number of PECs; in response to receiving the fast-cycling start command, enabling a standalone mode for an individual memory device of the set of memory devices that prevents the individual memory device from servicing host input/output requests; and executing fast-cycling operations on the individual memory device until the EOL condition is satisfied.

Example 18. A method comprising: receiving a fast-cycling start command to initiate a fast-cycling mode for a set of memory devices, the fast-cycling mode accelerating program-erase counts (PECs) of memory blocks to an end-of-life (EOL) condition, the EOL condition comprising a threshold number of PECs; in response to receiving the fast-cycling start command, enabling a standalone mode for an individual memory device of the set of memory devices that prevents the individual memory device from servicing host input/output requests; and executing fast-cycling operations on the individual memory device until the EOL condition is satisfied.

Example 19. The method of Example 18, comprising: adjusting program and erase voltage settings used by a set of channel processors to program and erase data blocks of the set of memory devices in response to receiving the fast-cycling start command; and performing fast-cycling of the set of memory devices using the adjusted program and erase voltage settings.

Example 20. The method of Example 19, comprising: obtaining normal program and erase voltage settings for a set of channel processors; obtaining EOL program and erase voltage settings; and computing the adjusted program and erase voltage settings by minimizing differences in voltage threshold distributions between the EOL program and erase voltage settings and the normal program and erase voltage settings.

The term “coupled with” generally refers to a connection between components, which can be an indirect communicative connection or direct communicative connection (e.g., without intervening components), whether wired or wireless, including connections such as electrical, optical, magnetic, and the like.

“System data” refers to data that is created and/or maintained by the memory sub-system for performing operations in response to host requests and for media management.

“User data” generally refers to host data and garbage collection data.

“Fast-cycling” refers to a special feature that applies adjusted memory device TRIM settings (program and/or erase threshold voltages) and drive configurations to accelerate PEC of memory blocks to EOL conditions, while maintaining substantially similar voltage threshold distributions and performance characteristics as normal cycling.

"End-of-life" (EOL) refers to a condition where a memory device has reached its target PEC of 10,000 cycles or more, at which point the memory device remains functional but operates at a reduced performance level compared to beginning-of-life (BOL) performance. At EOL, the memory device experiences increased errors requiring correction to maintain data reliability, though it continues to function within specification limits until exceeding the EOL threshold.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium (such as a non-transitory machine-readable medium) having stored thereon instructions, which can be used to program a computer system (or other electronic devices) to perform a process according to the present disclosure. A machine-readable medium includes any mechanism for storing information in a form readable by a machine (e.g., a computer). In some examples, a machine-readable (e.g., computer-readable) medium includes a machine (e.g., a computer) readable storage medium such as a ROM, RAM, magnetic disk storage media, optical storage media, flash memory components, and so forth. A machine-readable storage medium can be non-transitory (in other words, not having any transitory signals) in that it does not embody a propagating signal. However, labeling a machine-readable storage medium "non-transitory" should not be construed to mean that the machine-readable storage medium is incapable of movement; the machine-readable storage medium should be considered as being transportable from one physical location to another.

In the foregoing specification, examples of the disclosure have been described with reference to specific examples thereof. It will be evident that various modifications can be made thereto without departing from the broader scope of examples of the disclosure as set forth in the following claims. The specification and drawings are, accordingly, to be regarded in an illustrative sense rather than a restrictive sense.

What is claimed is:

1. A system comprising:

a set of memory devices; and a processing device, operatively coupled to the set of memory devices, programmed to perform operations comprising:

receiving a fast-cycling start command to initiate a fast-cycling mode for the set of memory devices, the fast-cycling mode accelerating program-erase counts (PECs) of memory blocks to an end-of-life (EOL) condition, the EOL condition comprising a threshold number of PECs;

in response to receiving the fast-cycling start command, enabling a standalone mode for an individual memory device of the set of memory devices that prevents the individual memory device from servicing host input/output requests; and executing fast-cycling operations on the individual memory device until the EOL condition is satisfied.

2. The system of claim 1, comprising:

a set of channel processors coupled to the processing device and the set of memory devices, the operations comprising:

adjusting program and erase voltage settings used by the set of channel processors to program and erase data blocks of the set of memory devices in response to receiving the fast-cycling start command; and performing fast-cycling of the set of memory devices using the adjusted program and erase voltage settings.

3. The system of claim 2, the operations comprising:

obtaining normal program and erase voltage settings for the set of channel processors;

obtaining EOL program and erase voltage settings; and computing the adjusted program and erase voltage settings by reducing differences in voltage threshold distributions between the EOL program and erase voltage settings and the normal program and erase voltage settings.

4. The system of claim 3, wherein the EOL program and erase voltage settings is obtained by:

configuring an individual channel processor to perform fast-cycling of a first memory device of the set of memory devices until the EOL condition is satisfied; and in response to determining that the EOL condition is satisfied, determining the EOL program and erase voltage settings associated with the first memory device.

5. The system of claim 1, wherein enabling the standalone mode comprises:

storing a current status of the individual memory device;

verifying the individual memory device is in an idle state; and storing media management parameters of the individual memory device.

6. The system of claim 1, wherein the operations further comprise:

receiving a status check command; and providing a status indicating whether fast-cycling operations are in progress, completed, or have errors in response to receiving the status check command.

7. The system of claim 1, wherein the operations further comprise:

receiving a cleanup command; and restoring the individual memory device to normal operation mode in response to receiving the cleanup command.

8. The system of claim 7, wherein restoring the individual memory device comprises:

setting PECs of the individual memory device based on the EOL condition; and restoring media management parameters for the individual memory device.

9. The system of claim 7, wherein the operations further comprise:

disabling media management operations on the set of memory devices during fast-cycling.

10. The system of claim 9, the media management operations comprising at least one of background scanning of memory blocks, refresh operations, or media scan operations.

11. The system of claim 1, wherein the operations further comprise:

maintaining a fast-cycling status variable that indicates a cycling status for each channel processor of a set of channel processors, each channel processor being associated with a respective group of memory devices of the set of memory devices.

12. The system of claim 11, wherein maintaining the fast-cycling status variable comprises:

updating the fast-cycling status variable in response to initiating fast-cycling operations on an individual channel processor of the set of channel processors; and updating the fast-cycling status variable in response to receiving an indication from the individual channel processor that fast-cycling operations on the group of memory device associated with the individual channel processor have been completed.

13. The fast-cycling status variable of claim 12, wherein the operations further comprise:

receiving a status check command; and providing a response indicating a current state of the fast-cycling status variable.

14. The fast-cycling status variable of claim 12, wherein:

the fast-cycling status variable is maintained by a front-end (FE) processor comprising the processing device; and each channel processor sends a completion status to the FE processor upon completing fast-cycling operations on its corresponding group of memory dies.

15. The system of claim 1, wherein the threshold number of PECs is 10,000 or more.

16. The system of claim 1, wherein the memory device comprises a three-dimensional (3D) NAND device.

17. At least one non-transitory machine-readable storage medium comprising instructions that, when executed by a processing device, cause the processing device to perform operations comprising:

receiving a fast-cycling start command to initiate a fast-cycling mode for a set of memory devices, the fast-cycling mode accelerating program-erase counts (PECs) of memory blocks to an end-of-life (EOL) condition, the EOL condition comprising a threshold number of PECs;

in response to receiving the fast-cycling start command, enabling a standalone mode for an individual memory device of the set of memory devices that prevents the individual memory device from servicing host input/output requests; and executing fast-cycling operations on the individual memory device until the EOL condition is satisfied.

18. A method comprising:

receiving a fast-cycling start command to initiate a fast-cycling mode for a set of memory devices, the fast-cycling mode accelerating program-erase counts (PECs) of memory blocks to an end-of-life (EOL) condition, the EOL condition comprising a threshold number of PECs;

in response to receiving the fast-cycling start command, enabling a standalone mode for an individual memory device of the set of memory devices that prevents the individual memory device from servicing host input/output requests; and executing fast-cycling operations on the individual memory device until the EOL condition is satisfied.

19. The method of claim 18, comprising:

adjusting program and erase voltage settings used by a set of channel processors to program and erase data blocks of the set of memory devices in response to receiving the fast-cycling start command; and performing fast-cycling of the set of memory devices using the adjusted program and erase voltage settings.

20. The method of claim 19, comprising:

obtaining normal program and erase voltage settings for a set of channel processors;

obtaining EOL program and erase voltage settings; and computing the adjusted program and erase voltage settings by minimizing differences in voltage threshold distributions between the EOL program and erase voltage settings and the normal program and erase voltage settings.

* * * * *